United States Patent
Park et al.

(10) Patent No.: US 7,730,612 B2
(45) Date of Patent: Jun. 8, 2010

(54) METHOD OF MANUFACTURING COMPONENT-EMBEDDED PRINTED CIRCUIT BOARD

(75) Inventors: Hwa-Sun Park, Suwon-si (KR); Sung Yi, Suwon-si (KR); Sang-Chul Lee, Gunpo-si (KR); Jong-Woon Kim, Daejeon (KR); Yul-Kyo Chung, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 16 days.

(21) Appl. No.: 12/081,858

(22) Filed: Apr. 22, 2008

(65) Prior Publication Data

US 2009/0049686 A1 Feb. 26, 2009

(30) Foreign Application Priority Data

Aug. 22, 2007 (KR) .................. 10-2007-0084627

(51) Int. Cl.
*H05K 3/30* (2006.01)
(52) U.S. Cl. .................. 29/837; 29/829; 29/830; 29/832; 29/25.42; 361/323; 174/260
(58) Field of Classification Search ............ 29/837, 29/832, 829, 830, 25.42; 361/323, 760, 761; 174/260, 262, 264, 266
See application file for complete search history.

(56) References Cited

U.S. PATENT DOCUMENTS

| 7,350,296 B2 * | 4/2008 | Ryu et al. ............ 29/852 |
| 2001/0027605 A1 * | 10/2001 | Nabemoto et al. .......... 29/830 |
| 2003/0221864 A1 * | 12/2003 | Bergstedt et al. ............ 174/260 |
| 2005/0048759 A1 * | 3/2005 | Hsu ........................ 438/618 |

* cited by examiner

*Primary Examiner*—Derris H Banks
*Assistant Examiner*—Jeffrey Carley

(57) ABSTRACT

A method of manufacturing a component-embedded printed circuit board is disclosed. The method includes: forming a blind hole in the first metal layer such that the first insulation layer is exposed, for a metal-clad laminate that includes a first metal layer stacked over a first insulation layer, securing a component to the first insulation layer by embedding the component in the blind hole, stacking a second insulation layer and a second metal layer on either side of the metal-clad laminate, and forming circuit patterns by removing portions of the metal layers.

3 Claims, 10 Drawing Sheets

METHOD OF MANUFACTURING COMPONENT-EMBEDDED PRINTED CIRCUIT BOARD

CROSS-REFERENCE TO RELATED APPLICATIONS

This application claims the benefit of Korean Patent Application No. 10-2007-0084627 filed with the Korean Intellectual Property Office on Aug. 22, 2007, the disclosure of which is incorporated herein by reference in its entirety.

BACKGROUND

1. Technical Field

The present invention relates to a method of manufacturing a component-embedded printed circuit board.

2. Description of the Related Art

In today's information age of rapidly changing cutting edge technology, the demand for higher-performance, miniature-size components is continuously increasing, with the goal of implementing a greater variety of functions in a smaller amount of space. Compared to components that are mounted on a board in the form of packages or by direct surface mounting, embedded type components can provide a greater amount of surface area on the board and can minimize signal transfer wires, to allow lower losses in high-frequency signals and higher efficiency. As such, embedded type components further the cause of higher-performance packaging trends.

As illustrated in the process diagram represented by FIG. 1 through FIG. 4, the related art for embedding a component may include attaching a tape 12 onto one side of a board, in which a through-hole 11 is formed, attaching the component 14 onto the tape 12 inside the through-hole 11, and then securing the component 14 with a filler. Afterwards, the tape 12 may be removed.

In thus manufacturing a component-embedded printed circuit board according to the related art, the use of the expended tape may cause an increase in process costs.

SUMMARY

An aspect of the invention is to provide a method of manufacturing a printed circuit board, in which a component may be embedded without using tape.

One aspect of the invention provides a method of manufacturing a component-embedded printed circuit board. The method includes: forming a blind hole in the first metal layer such that the first insulation layer is exposed, for a metal-clad laminate that includes a first metal layer stacked over a first insulation layer, securing a component to the first insulation layer by embedding the component in the blind hole, stacking a second insulation layer and a second metal layer on either side of the metal-clad laminate, and forming circuit patterns by removing portions of the metal layers.

The first metal layer may contain copper.

Also, securing the component to the first insulation layer can be performed by applying an adhesive on the component and attaching the component to the first insulation layer.

Additional aspects and advantages of the present invention will be set forth in part in the description which follows, and in part will be obvious from the description, or may be learned by practice of the invention.

DETAILED DESCRIPTION

Figure 1:
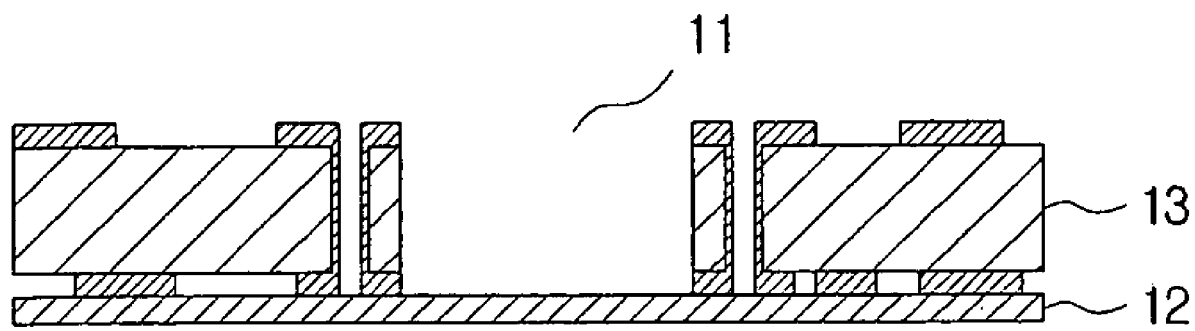
FIG. 1, FIG. 2, FIG. 3, and FIG. 4 are cross-sectional views representing a process diagram for manufacturing a component-embedded printed circuit board according to the related art.
Figure 2:
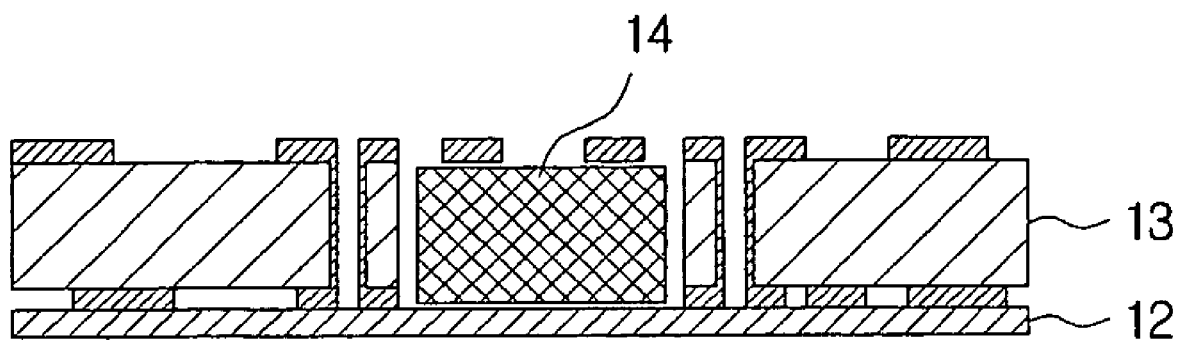
Figure 3:
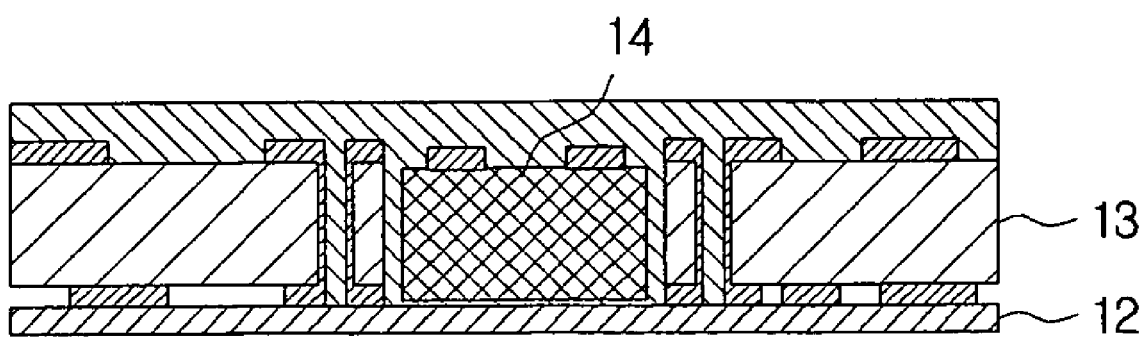
Figure 4:
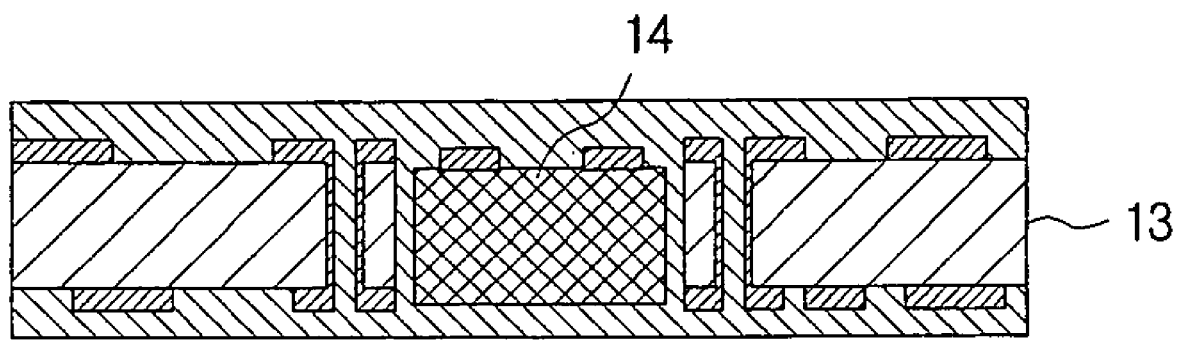

Certain embodiments of the invention will be described below in more detail with reference to the accompanying drawings. Those components that are the same or are in correspondence are rendered the same reference numeral regardless of the figure number, and redundant explanations are omitted.

Figure 5:
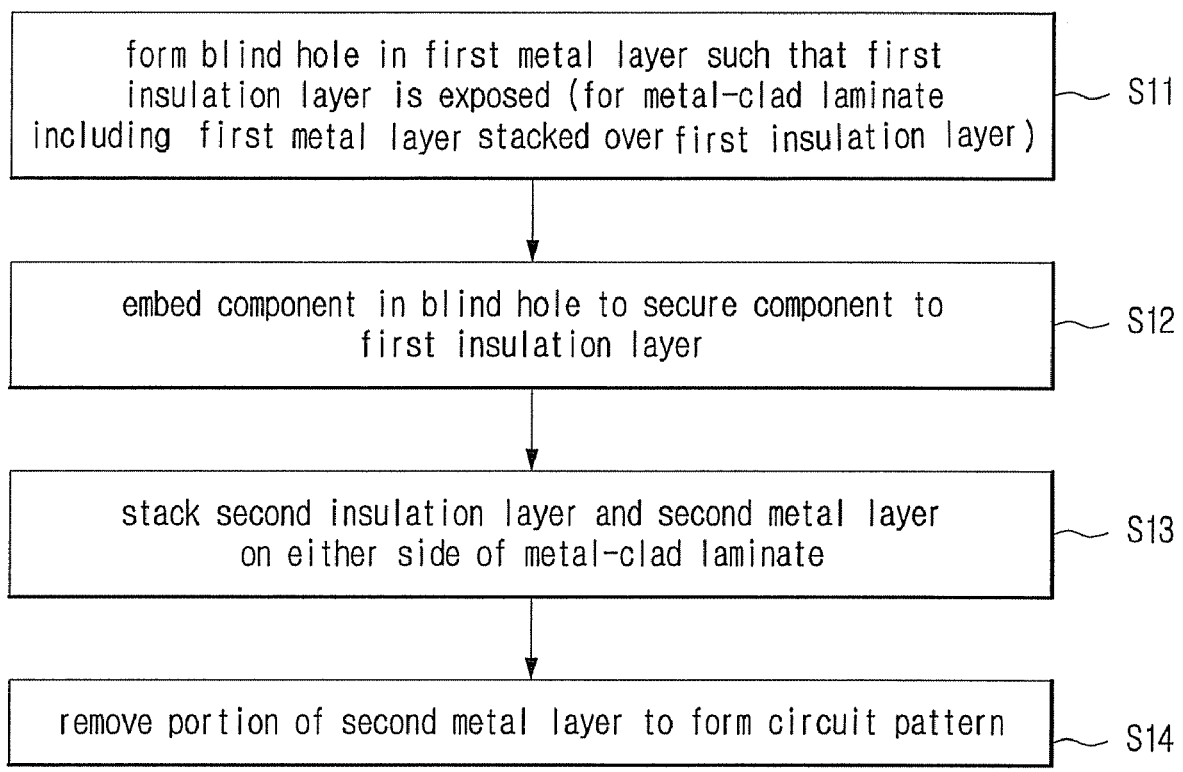
FIG. 5 is a flowchart illustrating a method of manufacturing a component-embedded printed circuit board according to an embodiment of the present invention.

FIG. 5 is a flowchart illustrating a method of manufacturing a component-embedded printed circuit board according to an embodiment of the present invention, while FIG. 6 through FIG. 10 are cross-sectional views representing a process diagram for manufacturing a component-embedded printed circuit board according to an embodiment of the present invention. In FIGS. 6 to 10, there are illustrated a component-embedded printed circuit board 30, a metal-clad laminate 31, a first metal layer 311, a first insulation layer 312, a blind hole 32, a through-hole 33, a component 34, adhesive 35, second insulation layers 36, second metal layers 37, and a via 38.

Figure 6:
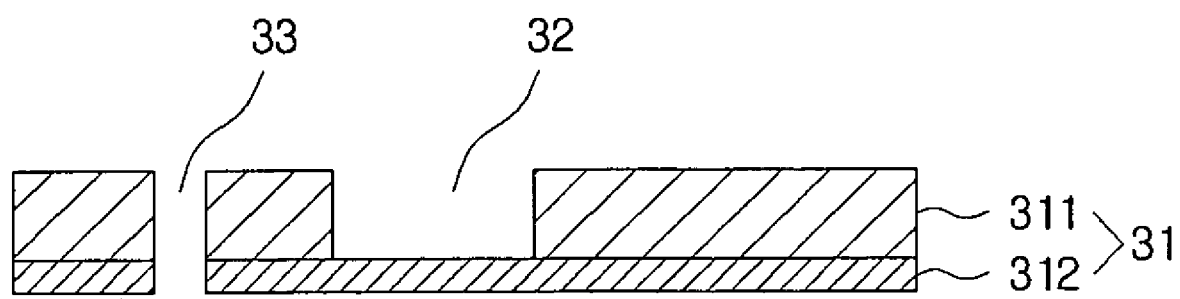
FIG. 6, FIG. 7, FIG. 8, FIG. 9, and FIG. 10 are cross-sectional views representing a process diagram for manufacturing a component-embedded printed circuit board according to an embodiment of the present invention.

Operation S11 may include forming a blind hole in the first metal layer such that the first insulation layer is exposed, for a metal-clad laminate that includes a first insulation layer stacked over a first metal layer, where FIG. 6 represents a corresponding process. Examples of a material that can be used for the first metal layer 311 may include copper and aluminum, etc. A first metal layer 311 may be stacked on the first insulation layer 312. A copper clad laminate can be used, as an electrical element that has this arrangement. Examples of a material that can be used for the insulation layer 312 may include resins and prepreg, which is made of a resin and glass fibers.

A blind hole 32 refers to a hole that is closed at one end. A blind hole 32 can be formed by stacking a photosensitive film over the first metal layer 311, removing a portion of the photosensitive film where the blind hole 32 is to be formed by exposure and development processes, and then etching the exposed first metal layer 311.

An alternate method may include forming a blind hole 32 by mechanical drilling. When using mechanical drilling, the metal-clad laminate 31 can be made by first perforating a hole that penetrates the first metal layer 311, and then stacking the first insulation layer 312 on one side of the first metal layer 311.

Independently from the blind hole 32, a process of forming a through-hole 33 may additionally be performed. In a subsequent process, plating may be performed in the through-hole 33, to form a via 38 that connects circuit patterns 39 formed on different layers.

Figure 7:
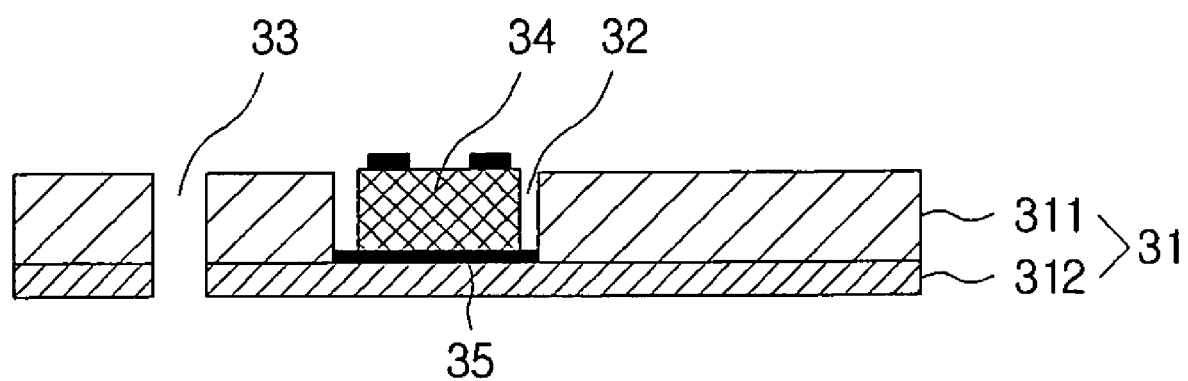

Operation S12 may include embedding a component in the blind hole to secure the component in the first insulation layer, where FIG. 7 represents a corresponding process. The reverse side of the component 34 may be secured to the first insulation layer 312 such that the electrode pads of the component 34 may be exposed to the exterior. The method of securing may include applying adhesive 35 between the first insulation layer 312 and the component 34.

Figure 8:
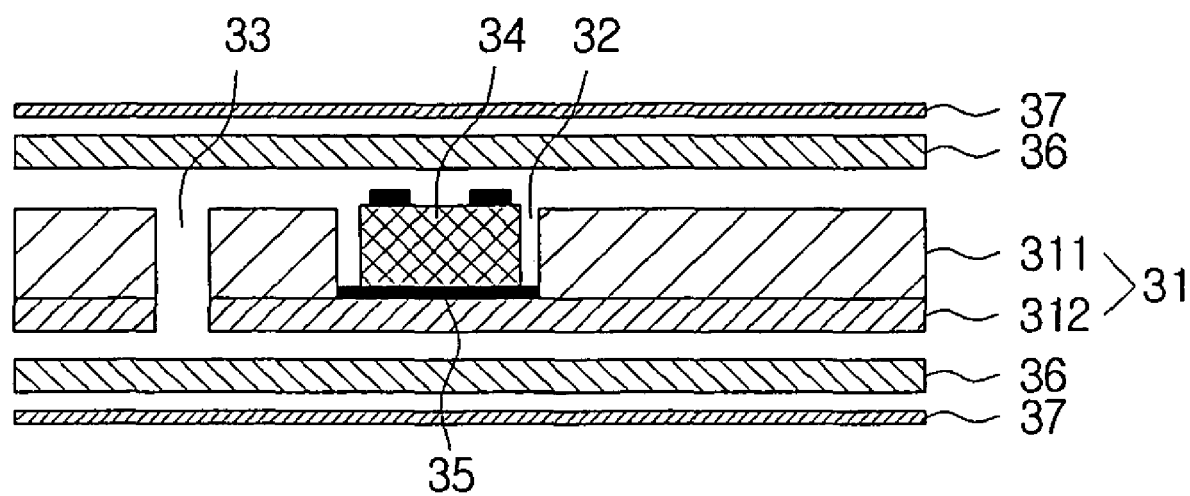
Figure 9:
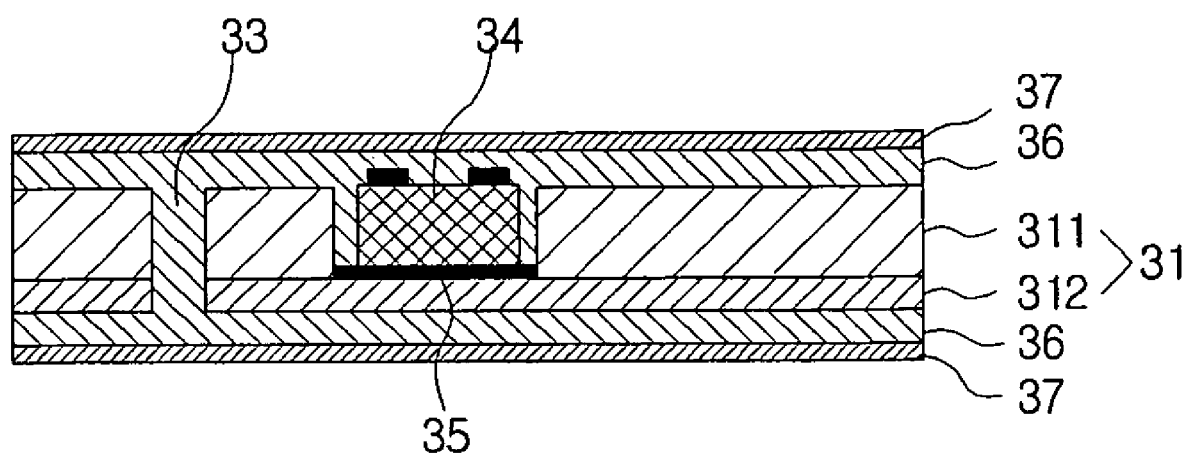

Operation S13 may include stacking a second insulation layer and a second metal layer on either side of the metal-clad laminate, where FIGS. 8 and 9 represent corresponding processes. The second insulation layer 36 can be made of a material having a high resin content. Also, the second insulation layer 36 can be in a semi-cured state, with the flow of resin facilitated by heat. After aligning the second insulation layers 36 and second metal layers 37 symmetrically about the metal-clad laminate 31, as in this embodiment, performing a collective stacking procedure can result in the configuration shown in FIG. 9. The collective stacking process may include applying physical force, as well as applying heat to facilitate the flow of resin contained in the second insulation layer 36. Consequently, a portion of the resin of the second insulation layer 36 may enter the blind hole 32 and fill in the space around the component 34. Later, when a curing process is performed, the component 34 may be secured to a stable arrangement.

Figure 10:
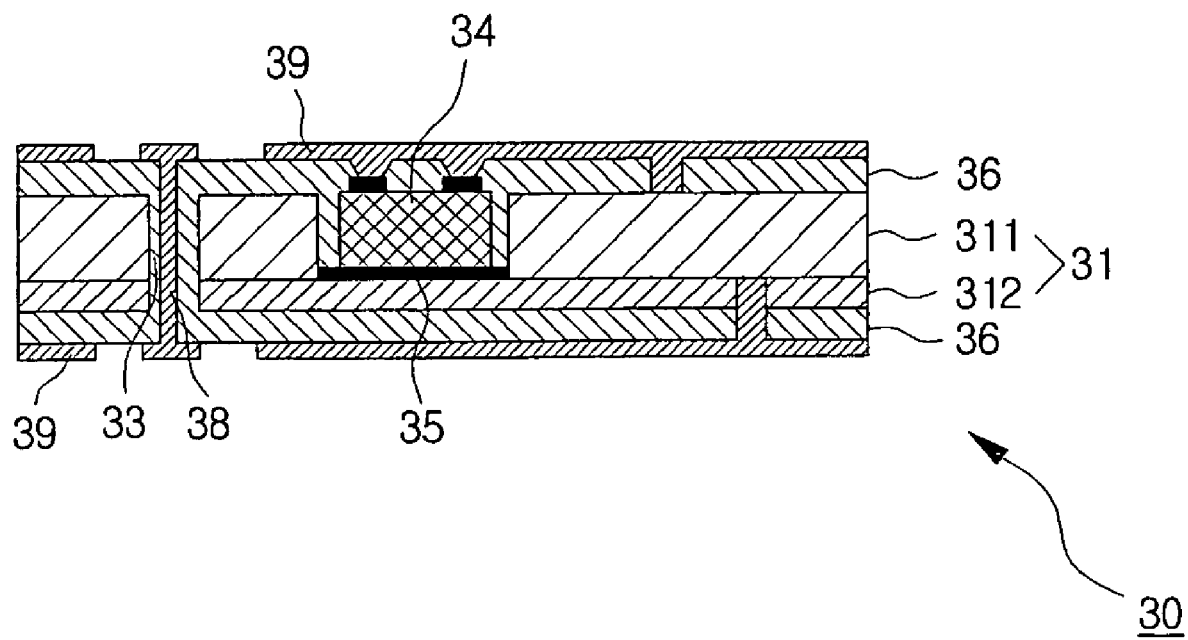

Operation S14 may include removing portions of the second metal layers to form circuit patterns, where FIG. 10 represents a corresponding process. The process of removing portions of the second metal layers 37 to form the circuit patterns 39 may be a part of a typical process for manufacturing a printed circuit board, and may include stacking photosensitive film over the second metal layers 37 of FIG. 9, and selectively removing the photosensitive film in portions outside the regions where the circuit patterns 39 are to be formed. Afterwards, the second metal layers 37 can be etched to form the circuit patterns 39. Copper may generally be used as the material for the second metal layers 37.

Before forming the circuit patterns 39, vias 38 may be performed, as in FIG. 9, by perforating through-holes 33 using mechanical drilling, for example, and plating the insides of the through-holes 33. The vias 38 may be used to electrically connect circuit patterns 39 formed on different layers.

According to certain embodiments of the invention as set forth above, a component may be embedded in a blind hole formed by removing a portion of the first metal layer in a metal-clad laminate such that the first insulation layer is exposed. In this way, the component can be embedded without using tape. Thus, the manufacturing process can be simplified, and costs can be reduced. Moreover, the metal layer may effectively be used as a heat-releasing material.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a component-embedded printed circuit board, the method comprising:
   providing a metal-clad laminate comprising a first insulation layer and a first metal layer, the first metal layer being stacked over the first insulation layer, a thickness of the first metal layer being substantially the same as a thickness of the component;
   forming a blind hole in the first metal layer such that a portion of the first insulation layer is exposed;
   securing the component to the first insulation layer by embedding the component in the blind hole;
   stacking a second insulation layer and a second metal layer on either side of the metal-clad laminate; and
   forming circuit patterns by removing portions of the metal layers.

2. The method of claim 1, wherein the first metal layer contains copper.

3. The method of claim 1, wherein the securing is performed by applying an adhesive on the component and attaching the component to the first insulation layer.

* * * * *